United States Patent [19]

Iwase

[11] Patent Number: 5,349,563
[45] Date of Patent: Sep. 20, 1994

[54] MASK ROM

[75] Inventor: Taira Iwase, Kawasaki, Japan

[73] Assignee: Kabushiki Kaisha Toshiba, Kawasaki, Japan

[21] Appl. No.: 41,587

[22] Filed: Apr. 5, 1993

[30] Foreign Application Priority Data

Apr. 3, 1992 [JP] Japan .................... 4-081238

[51] Int. Cl.$^5$ .................................. G11C 8/00
[52] U.S. Cl. .................. 365/230.01; 365/230.03; 365/103; 365/189.01
[58] Field of Search ............ 365/230.01, 230.03, 365/189.01, 103, 104, 182, 184, 212

[56]  References Cited

U.S. PATENT DOCUMENTS

| | | | |
|---|---|---|---|
| 4,958,326 | 9/1990 | Sakurai | 365/230.03 |
| 5,193,076 | 3/1993 | Houston | 365/230.03 |
| 5,202,843 | 4/1993 | Nakagawara | 365/184 |
| 5,245,570 | 9/1993 | Fazio | 365/230.03 |

OTHER PUBLICATIONS

Symposium VLSI Circuits, Mikiro Okada et al., "16 Mb ROM Design Using Bank Select Architecture" published in Aug., 1988.

Primary Examiner—Eugene R. LaRoche
Assistant Examiner—Tan Nguyen
Attorney, Agent, or Firm—Foley & Lardner

[57] ABSTRACT

A mask ROM having a plurality of memory cell blocks, each composed of a main bit line, a ground line, and a plurality of memory cells for storing information. The mask ROM also includes a sense amplifier for reading the information stored in the memory cells via the main bit line. The mask ROM has a plurality of first block selecting means for selecting a memory cell block connected to the main bit line from a plurality of the memory cell blocks and a plurality of second block selecting means for selecting a memory cell block connected to the ground line from a plurality of the memory cell blocks. The first and second block selecting means are arranged alternately, with the memory cell block sandwiched therebetween.

5 Claims, 7 Drawing Sheets

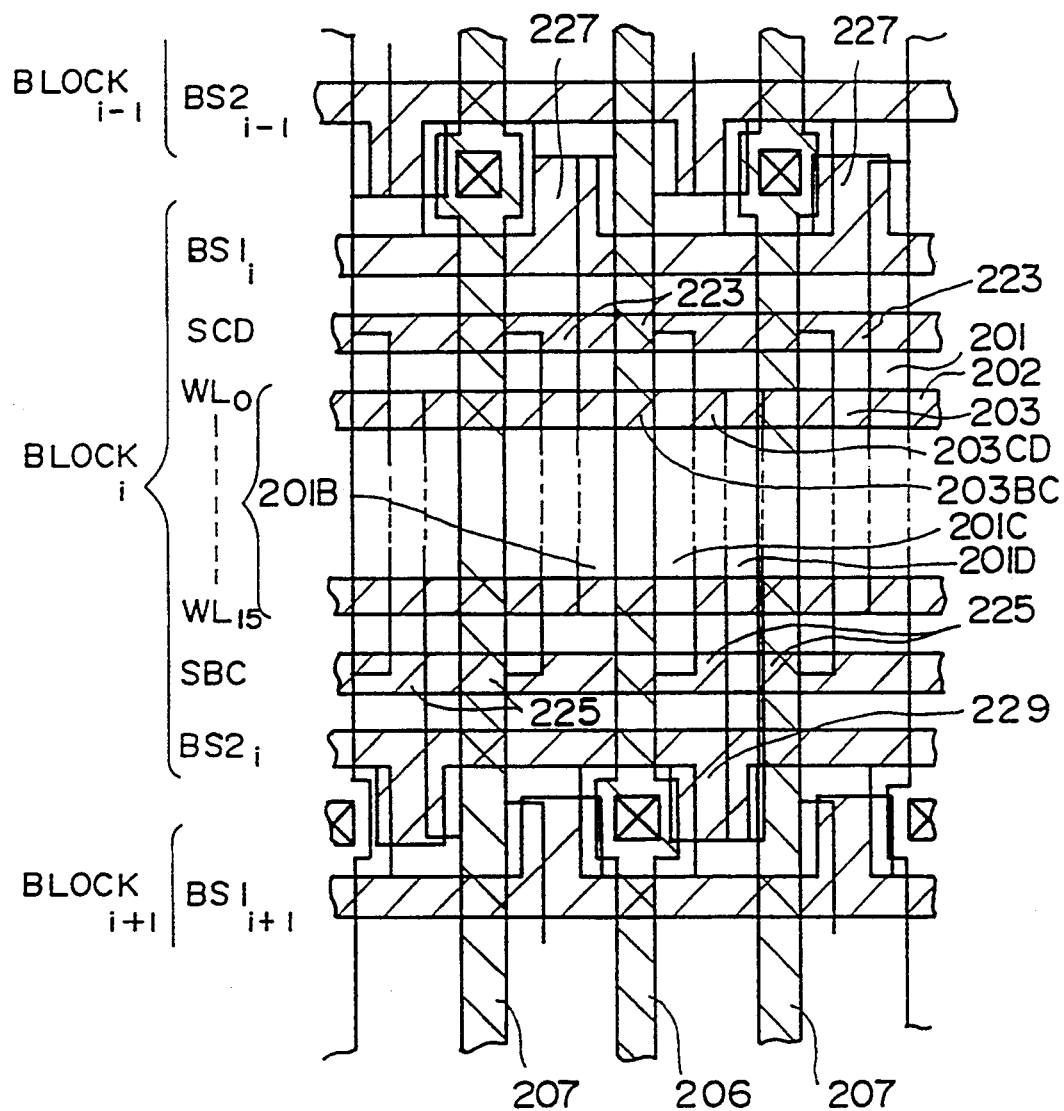
F I G. 4

MASK ROM

FIELD OF THE INVENTION

The present invention relates to a mask ROM (Read Only Memory), and more specifically to a NOR type mask ROM.

BACKGROUND OF THE INVENTION

As a mask ROM of large capacity, there has been widely used such a NOR type mask ROM that the sources and the drains of memory cells are formed by N conductive type diffusion layers and the word lines are arranged perpendicular to the N conductive type diffusion layers.

FIG. 1 shows a circuit configuration of a memory cell array of a mask ROM, and FIG. 2 is a plan view of the same memory cell array.

In FIG. 1, the vertical bit lines 101 are formed by an N conductive type diffusion layer, and the horizontal word lines 102 are formed by a polyside. The NOR type bit lines 101 and the word lines 102 are arranged so as to intersect each other. The memory cell transistors 103 are formed in such a way that the source and drain regions are formed at the intersection portions, and the channels are formed between the intersection portions. The memory cell transistors 103 are manufactured by a technique of adjusting the impurity diffusion quantity of the channels. Each memory cell transistor 103 is formed to be turned on or off on the basis of a predetermined gate voltage according to whether an information bit is to be held by the cell. In the flat cells of the structure described above, since the N conductive type diffusion layers are used as bit lines, the resistance and the junction capacity of the bit lines inevitably become large. Accordingly, a block select structure is adopted to reduce the resistance and capacitance; that is, to realize a high speed reading operation. In the memory cell array shown in FIG. 1, only an i-th block is shown. Each block group is composed of 16 units of memory cells having even column select transistors 104 and odd column select transistors 105 both connected on both the ends of the bit lines 101 within each block, and 16 word lines $WL_0$ to $WL_{15}$ are connected as the respective gate electrodes thereof. The memory cell array is divided into 256 blocks in the direction of the bit lines 101. The respective bit lines 101 are connected to a main bit line 106 (formed of aluminum) via the even column select transistors 104 and the odd column select transistors 105. The lower end of the main bit line 106 is connected to a sense amplifier 114 via a column select transistor 113 controlled by a column select line CS. A virtual ground line 107 (also formed of aluminum) is connected to the source of the memory cell transistors 103 via the even column select transistors 104 and the odd column select transistors 105. The lower end of the virtual ground line 107 is grounded via a virtual ground select transistor 115 controlled by both the column select transistor 113 and a virtual ground select line VS. The main bit line 106 and the virtual ground line 107 are arranged adjacent to each other. Each of the memory cells belongs either to the even column 108 or the odd column 109. Therefore, it is possible to select any even column 108 or the odd column 109 by switching the even column select transistors 104 and the odd column select transistors 105 arranged on both ends of the bit lines 101.

To read data on the even column, when the even column select line 110 and a word line (e.g., $WL_{15}$) are selected, for instance, these lines are changed to a high level (referred to as the "H" level), so that the even column select transistor 104 is turned on. Therefore, the source and the drain of the memory cell transistor 103' are connected to the aluminum virtual ground line 107 and the main bit line 106, respectively. Under these conditions, the odd column select line 111 is at a low level (referred to as the "L" level), so that the odd column select transistors 105 are kept off. Although the gate of the odd column memory cell 103'' is also set to the "H" level via the word line $WL_{15}$, since the sources and the drains of the odd column memory cells are shorted by the turned-on even column select transistors 104, the memory cell transistor 103'' is kept off.

Successively, the column select line changes to the "H" level, and the virtual ground select line VS changes to the "H" level, so that the virtual ground line 107 is grounded in potential. Therefore, the main bit line 106 is connected to the sense amplifier 114.

Accordingly, when the even column select line 110 of the i-th block and the word line $WL_{15}$ are selected, the value stored in the memory cell transistor 103' can be read by a sense amplifier 114 according to the presence or absence of the current flowing through the memory cell transistor 103'. The values stored in the memory cells arranged on the odd column can be read in the same way as above.

In the memory structure as described above, however, the current required to read data flows along the U-shaped route (the memory cell is at the base thereof). For instance, when the memory cell transistor 103' arranged on the even column is required to be accessed, current flows from a contact hole 112 to the even column select transistor 104 and further passing through both ends of the bit line 101 of a large resistance of the N conductive type diffusion layer. If the length of the bit line 101 of the N conductive type diffusion layer is l in the row direction thereof, the current flows through the N concductive type diffusion layer as long as a length of 2l at the worst. Therefore, a high voltage drop develops across the N conductive type diffusion layer, so that the number of word lines to be arranged within a single block is limited. In addition, since the voltage drop value differs according to the physical position of the selected memory cell, there exists a problem in that the margin (allowable range) of the sense amplifier is inevitably reduced.

SUMMARY OF THE INVENTION

With these problems in mind, therefore, it is the object of the present invention to provide a mask ROM in which a number of word lines can be arranged within a single block without exerting a harmful influence upon the margin of the sense amplifier, and in addition the number of the select lines can be reduced to reduce the area per unit bits.

To achieve the above-mentioned object, the present invention provides a mask ROM having a plurality of memory cell blocks each composed of a main bit line, a ground line, and a plurality of memory cells for storing information; and a sense amplifier for reading the information stored in the memory cells via the main bit line, which comprises: a plurality of first block selecting means for selecting a memory cell block connected to the main bit line from a plurality of the memory cell blocks; and a plurality of second block selecting means for selecting a memory cell block connected to the ground line from a plurality of the memory cell blocks, said first and second block selecting means being arranged alternately with the memory cell block sandwiched therebetween.

To achieve the above-mentioned object, in the mask ROM, the first and second block selecting means are used in common for adjacent memory cell blocks.

To achieve the above-mentioned object, the mask ROM further comprises switching means connected between the main bit line and a plurality of said memory cell blocks, for connecting the main bit line to the selected memory cell block in response to a select command given by said first block selecting means.

BRIEF DESCRIPTION OF THE DRAWINGS

FIG. 4 is a plane view showing the first embodiment of the mask ROM according to the present invention;

DETAILED DESCRIPTION OF THE PREFERRED EMBODIMENTS

Figure 1:
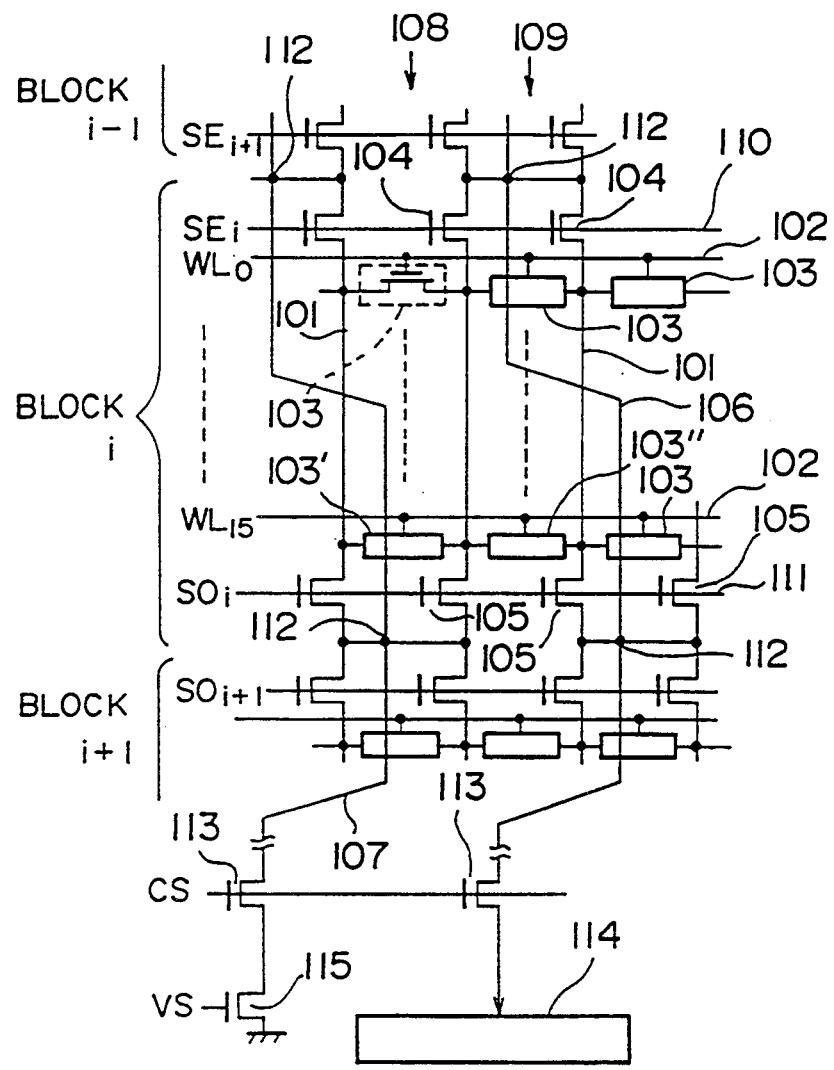
FIG. 1 is a circuit configuration of a conventional mask ROM.
Figure 2:
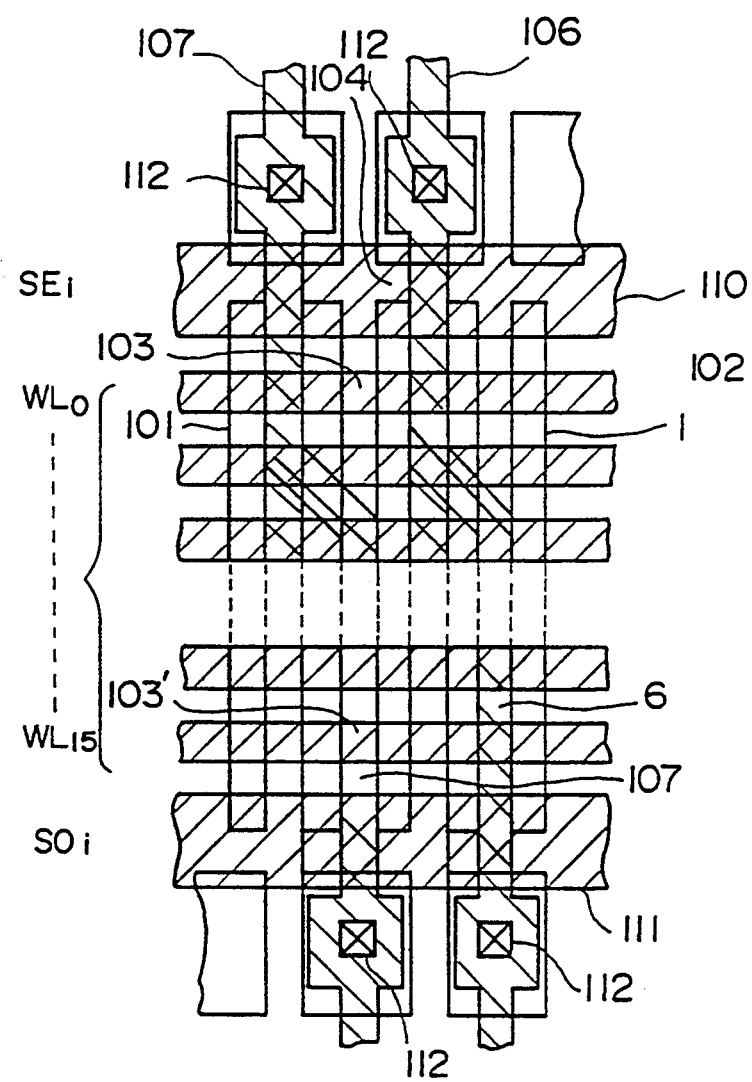
FIG. 2 is a plan view showing the conventional mask ROM.
Figure 3:
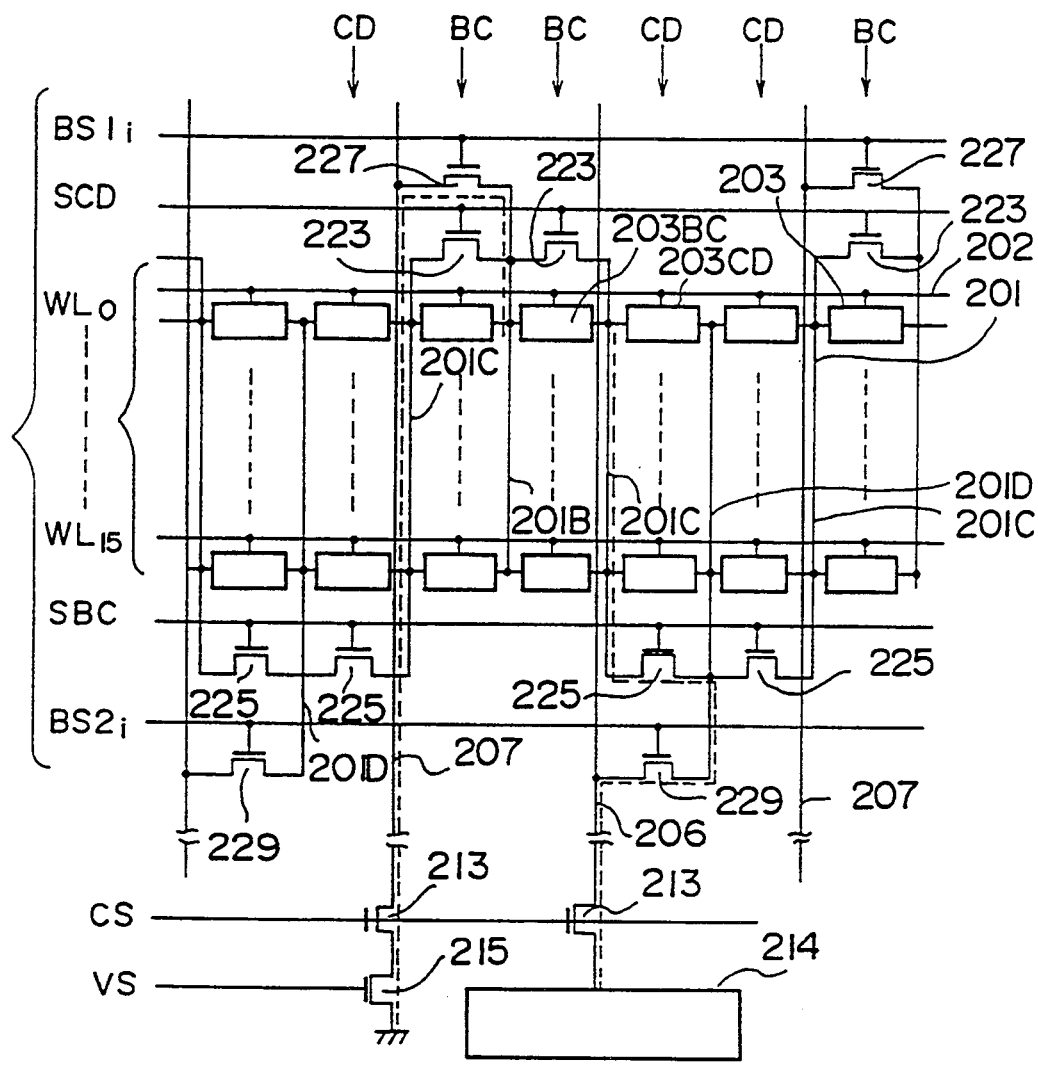
FIG. 3 is a circuit configuration of a first embodiment of the mask ROM according to the present invention.

A first embodiment of the NOR type mask ROM memory cell array according to the present invention is described with reference to FIGS. 3 and 4. FIG. 3 shows a circuit configuration of the memory cell array of the i-th block of the mask ROM; and FIG. 4 is a plan view showing the same memory cell array.

In these drawings, the vertical bit lines 201 are formed by an N conductive type diffusion layer. The horizontal word lines 202 are formed by a polyside. The bit lines 201 and the word lines 202 are arranged to intersect each other. The memory cell transistors 203 of the NOR type are formed in such a way that the source and drain regions thereof are formed at the intersection portions and the channels thereof are formed between the intersection portions. Each of the memory cell transistors 203 is so formed as to be turned on or off on the basis of a predetermined gate voltage according to an information bit to be held by the cell. Each block is composed of a set of bit lines formed of the N conductive type diffusion layer, and a group of 16 memory cells having the respective gate electrodes connected to 16 word lines $WL_0$ to $WL_{15}$, respectively. The memory cell array is divided into 256 blocks in the direction of the bit lines 201. A main bit line 206 formed of aluminum is provided in parallel to the bit lines 201 over a plurality of the blocks. The lower end of the main bit line 206 is connected to a sense amplifier 214 via a column select transistor 213 controlled by a column select line CS. A virtual ground lines 207 (also formed of aluminum) is provided in parallel with the bit lines 201 over a plurality of blocks. The lower end of the virtual ground line 207 is grounded via a virtual ground select transistor 215 controlled by both the column select transistor 213 and a virtual ground select line VS. The bit lines 201 formed by the N conductive type diffusion layer are divided into three sets B, C and D, and further arranged in the order of . . . , B, C, D, C, B, C, . . . . The memory cell transistors 203 are divided into memory cell transistors 203BC, each having a source connected to the bit line 201B and a drain connected to the bit line 201C, and memory cell transistors 203CD each having a source connected to the bit line 201C and a drain connected to the bit line 201D. Therefore, the memory cell transistors 203 are also arranged in the order of . . . , BC, BC, CD, CD, BC, . . . . The bit line 201B and the bit line 201C are connected by a MOS transistor 223 controlled by a CD cell select line SCD. The bit line 201D and the bit line 201C are connected by a MOS transistor 225 controlled by a BC cell select line SBC. Further, the bit line 201B is connected to the virtual ground line 207 via a transistor 227 controlled by the first i-th block select line $BS1_i$. Further, the bit line 201D is connected to the main bit line 206 via a transistor 229 controlled by the second i-th block select line $BS2_i$.

The data reading operation of the memory transistor 203BC will be described hereinbelow. When the first i-th block select line $BS1_i$ is set to the "H" level and the MOS transistor 227 is turned on, the bit line 201B and the virtual ground line 207 are connected to each other. Further, when the second i-th block select line $BS2_i$ is set to the "H" level and the MOS transistor 229 is turned on, the bit line 201D and the main bit line 206 are connected to each other. Successively, when the BC cell select line SBC is set to the "H" level, the MOS transistor 225 is turned on, so that the bit line 201D and the bit line 202C are connected to each other. Since the CD cell select line SCD is at the "L" level, the MOS transistor 223 is turned off. Successively, when the column select line CS is set to the "H" level and the virtual ground select line VS is set to the "H" level, the bit line 201B is set to the ground level, and the bit line 201C is connected to the sense amplifier 214. Then, when the selected word line (e.g., $WL_0$) is set to the "H" level, current flows between the main bit line 206 and the virtual ground line 207 according to the value written in the memory transistor 203BC. This current is sensed by the sense amplifier 214. The current route at this time is shown by dashed lines in FIG. 3.

The data reading operation of the memory transistor 203CD will be described hereinbelow. When the first i-th block select line $BS1_i$ is set to the "H" level and the MOS transistor 227 is turned on, the bit line 201B and the virtual ground line 207 are connected to each other. Further, when the second i-th block select line $BS2_i$ is set to the "H" level and the MOS transistor 229 is turned on, the bit line 201D and the main bit line 206 are connected to each other. Successively, when the CD cell select line SCD is set to the "H" level, the MOS transistor 223 is turned on, so that the bit line 201B and the bit line 201C are connected to each other. Since the BC cell select line SBC is at the "L" level, the MOS transistor 225 is turned off. Successively, when the column select line CS is set to the "H" level and the virtual ground select line VS is set to the "H" level, the bit line 201C is set to the ground level, and the bit line 201D is connected to the sense amplifier 214. Then, when the selected word line (e.g., $WL_0$) is set to the "H" level, current flows between the main bit line 206 and the virtual ground line 207 according to the value written in the memory transistor 203CD. This current is sensed by the sense amplifier 214.

As described above, in the first embodiment of the mask ROM, since the current path becomes that shown by dashed lines in FIG. 3, it is possible to reduce the current path length through the N conductive type diffusion layer to half that of the conventional mask ROM, so that the voltage drop therethrough can be reduced by half. As a result, it is possible to arrange a larger number of word lines (e.g., 32 lines) within a single block, as compared with the conventional mask ROM. In addition, the voltage drop value is not subjected to the influence of the physical position of the selected memory cell. Therefore, it is possible to solve the problem such that the margin of the sense amplifier is reduced.

Figure 5:
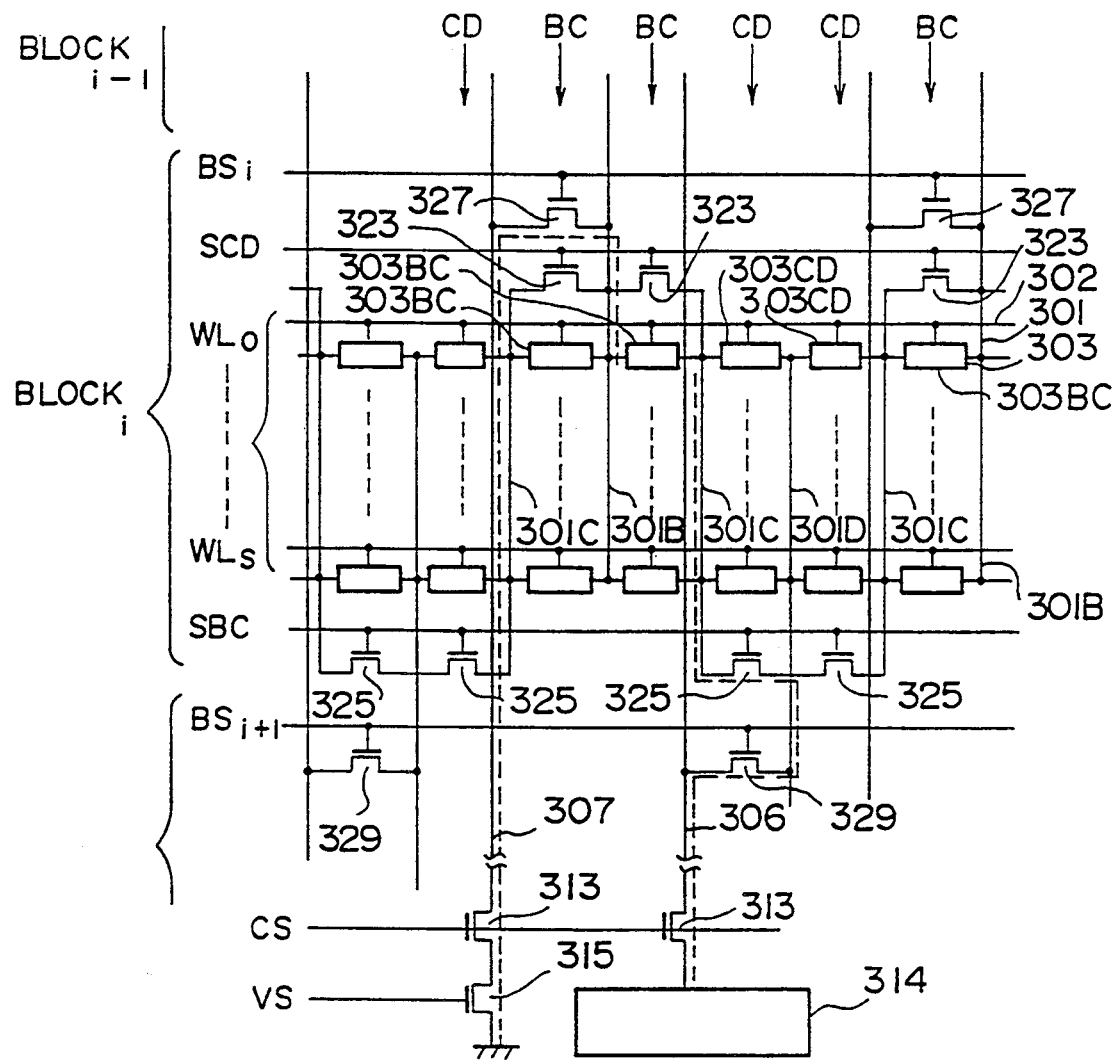
FIG. 5 is a circuit configuration of a second embodiment of the mask ROM according to the present invention.
Figure 6:
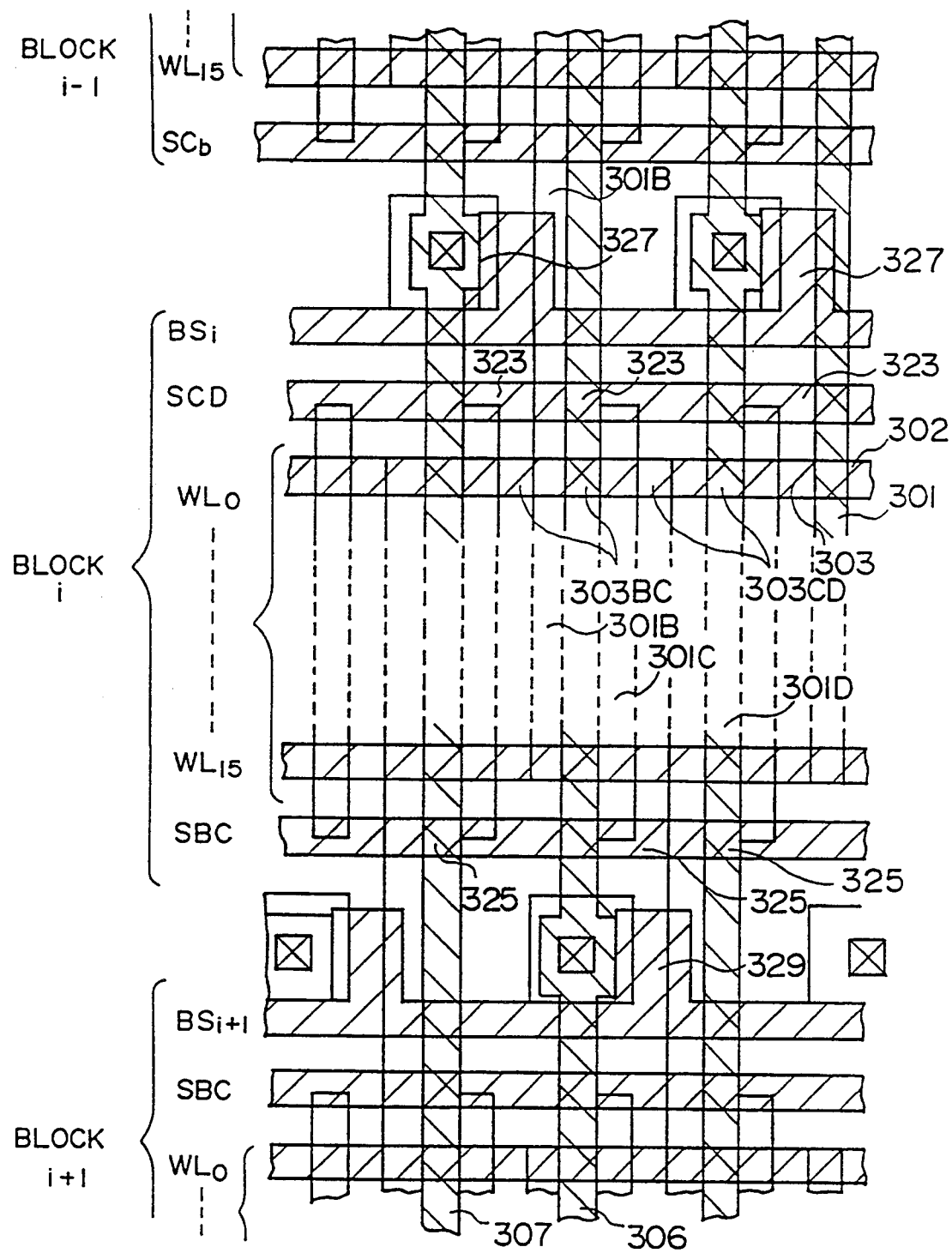
FIG. 6 is a plan view showing the second embodiment of the mask ROM according to the present invention.

FIG. 5 shows a circuit configuration of the memory cell array of the i-th block of the mask ROM; and FIG. 6 is a plan view showing the same memory cell array with respect to a second embodiment of the NOR type mask ROM memory cell array according to the present invention.

In FIG. 5, the vertical bit lines 301 are formed by an N conductive type diffusion layer, while the horizontal word lines 302 are formed by a polyside. The bit lines 301 and the word lines 302 are arranged to intersect each other. The memory cell transistors 303 of the NOR type are formed in such a way that the source and drain regions thereof are formed at the intersection portions and the channels thereof are formed between the intersection portions. Each of the memory cell transistors 303 is so formed as to be turned on or off on the basis of a predetermined gate voltage according to an information bit to be held by the cell. Each block is composed of a set of bit lines, and a group of 16 memory cells having the respective gate electrodes connected to 16 word lines $WL_0$ to $WL_{15}$, respectively. The memory cell array is divided into 256 blocks in the direction of the bit lines 301. A main bit line 306 formed of aluminum is provided in parallel to the bit lines 301 over a plurality of the blocks. The lower end of the main bit line 306 is connected to a sense amplifier 314 via a column select transistor 313 controlled by a column select line CS. A virtual ground line 307 (also formed of aluminum) is provided in parallel to the bit lines 301 over a plurality of the blocks. The lower end of the virtual ground line 307 is grounded via a virtual ground select transistor 315 controlled by both the column select transistor 313 and a virtual ground select line VS. The bit lines 301 formed by the N conductive type diffusion layer are divided into three sets of B, C and D and further arranged in the order of ..., B, C, D, C, B, C, .... Here, the bit line 301B extends from the i-th block to the (i-1)th block, to be used in common as the bit lines of the respective B sets of the i-th and (i-1)th blocks. Further, the bit line 301D extends from the i-th block to the (i+1)th block, to be used in common as the bit lines of the respective D sets of the i-th and (i+1)th blocks. The memory cell transistors 303 are divided into memory cell transistors 303BC, each having a source connected to the bit line 301B and a drain connected to the bit line 301C and memory cell transistors 303CD each having a source connected to the bit line 301C and a drain connected to the bit line 301D. Therefore, the memory cell transistors 303 are also arranged in the order ..., BC, BC, CD, CD, BC, .... The bit line 301B and the bit line 301C are connected by a MOS transistor 323 controlled by a CD cell select line SCD. The bit line 301D and the bit line 301C are connected by a MOS transistor 325 controlled by a BC cell select line SBC. Further, the bit line 301B is connected to the virtual ground line 307 via a transistor 327 controlled by the i-th block select line $BS_i$. Further, the bit line 301D is connected to the main bit line 306 via a transistor 329 controlled by the (i+1)th block select line $BS_{i+1}$.

The data reading operation of the memory cell transistor 303BC will be described hereinbelow. When the i-th block select line $BS_i$ is set to the "H" level and the MOS transistor 327 is turned on, the bit line 301B and the virtual ground line 307 are connected to each other. Further, when the (i+1)th block select line $BS_{i+1}$ is set to the "H" level and the MOS transistor 329 is turned on, the bit line 301D and the main bit line 306 are connected to each other. Successively, when the BC cell select line SBC is set to the "H" level, the MOS transistor 325 is turned on, so that the bit line 301D and the bit line 301C are connected to each other. Since the CD cell select line SCD is at the "L" level, the MOS transistor 323 is turned off. Successively, when the column select line CS is set to the "H" level and the ground select line VS is set to the "H" level, the bit line 301B is set to the ground level, and the bit line 301C is connected to the sense amplifier 314. Then, when the selected word line (e.g., $WL_0$) is set to the "H" level, current flows between the main bit line 306 and the virtual ground line 307 according to the value written in the memory transistor 303BC. This current is sensed by the sense amplifier 314. The current route at this time is shown by dashed lines in FIG. 5.

The data reading operation of the memory transistor 303CD will be described hereinbelow. When the i-th block select line $BS_i$ is set to the "H" level and the MOS transistor 327 is turned on, the bit line 301B and the virtual ground line 307 are connected to each other. Further, when the (i+1) th block select line $BS_{i+1}$ is set to the "H" level and the MOS transistor 329 is turned on, the bit line 301D and the main bit line 306 are connected to each other. Successively, when the CD cell select line SCD is set to the "H" level, the MOS transistor 323 is turned on, so that the bit line 301B and the bit line 303C are connected to each other. Since the BC cell select line SBC is at the "L" level, the MOS transistor 325 is turned off. Successively, when the column select line CS is set to the "H" level and the ground select line VS is set to the "H" level, the bit line 301C is set to the ground level, and the bit line 301D is connected to the sense amplifier 314. Then, when the selected word line (e.g., $WL_0$) is set to the "H" level, current flows between the main bit line 306 and the virtual ground line 307 according to the value written in the memory transistor 303CD. This current is sensed by the sense amplifier 314.

In more generic case, when the j-th block is required to be accessed, the j-th block select line and the (j+1)th block select line are set to the "H" level. As described above, it is possible to activate the selected block by turning on the two transistors arranged on the grounded side and the sense amplifier side. As a result, only a single block select signal line is allocated to the single block. That is, three signal lines in total (in addition to the BC cell select line SBC and the CD cell select line SCD) are allocated to the single block, with the result that it is possible to reduce the signal lines by one, as compared with the conventional mask ROM and thereby to reduce the cell area required for unit bits.

In the second embodiment of the mask ROM, since the current path becomes that shown by dashed lines in FIG. 5, it is possible to reduce the current path length through the N conductive type diffusion layer to half of the conventional mask ROM, so that the voltage drop therethrough can be reduced by half. As a result, it is possible to arrange a larger number of word lines (e.g., 32 lines) within a single block, as compared with the conventional mask ROM. In addition, the voltage drop value is not subjected to the influence of the physical position of the selected memory cell. Therefore, it is possible to solve the problem such that the margin of the sense amplifier is reduced.

Figure 7:
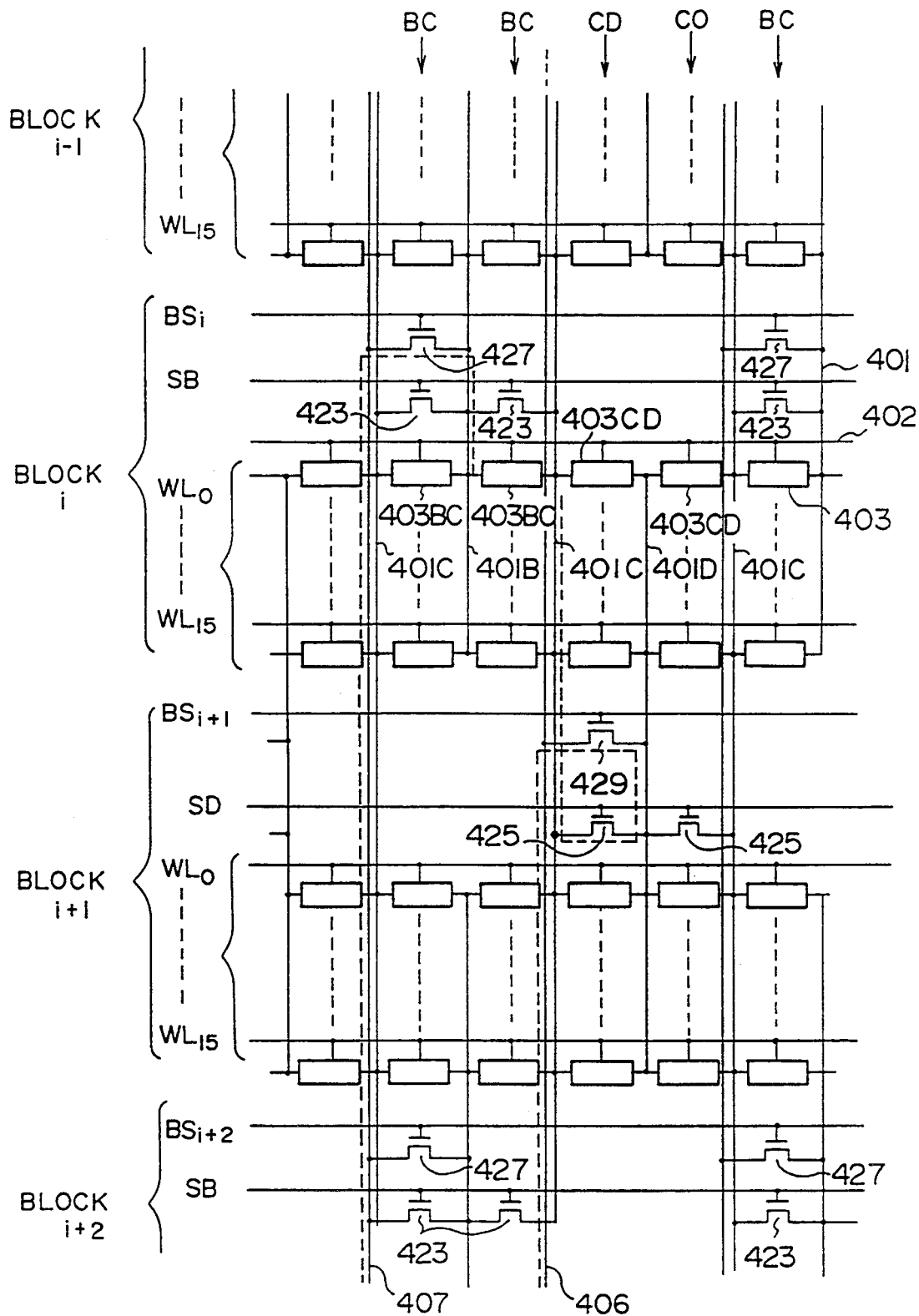
FIG. 7 is a circuit configuration of a third embodiment of the mask ROM according to the present invention.

A third embodiment of the NOR type mask ROM memory cell array according to the present invention will be described hereinbelow with reference to FIG. 7. FIG. 7 shows a circuit configuration of the memory cell arrays of the i-th and (i+1)th blocks of the mask ROM.

In FIG. 7, the vertical bit lines 401 are formed and the horizontal word lines 402 are formed. The bit lines 401 and the word lines 402 are arranged so as to intersect each other. In the same way as in the first embodiment, the memory cell transistors 403 of NOR structure are arranged. Each of the memory cell transistors 403 is formed as to be turned on or off on the basis of a predetermined gate voltage according to an information bit held by the cell. Each block is composed of a set of bit lines and a group of 16 memory cells having the respective gate electrodes connected to 16 word lines $WL_0$ to $WL_{15}$, respectively. The memory cell array is divided into 256 blocks in the direction of the bit lines 401. A main bit line 406 is provided in parallel to the bit lines 401 over a plurality of the blocks. The lower end of the main bit line 406 is connected to a sense amplifier via a column select transistor (both not shown). Further, a virtual ground line 407 is provided in parallel to the bit lines 401 over a plurality of the blocks. The lower end of the virtual ground line 407 is grounded via a column select transistor and a virtual ground select transistor (both not shown). The bit lines 401 are divided into three sets of B, C and D and further arranged in the order of ..., B, C, D, C, B, C, .... Here, the bit line 401B extends from the i-th block to the (i-1)th block so as to be used in common as the bit lines of the respective B sets of the i-th and (i-1)th blocks. Further, the bit line 401D extends from the i-th block to the (i+1)th block so as to be used in common as the bit lines of the respective D sets of the i-th and (i+1)th blocks. Further, a long bit line 401C extends from the first block to the 256th block so as to become the bit line common to all of the blocks. The memory cell transistors 403 are divided into memory cell transistors 403BC, each having a source connected to the bit line 401B and a drain connected to the bit line 401C, and memory cell transistors 401CD each having a source connected to the bit line 401C and a drain connected to the bit line 401D. Therefore, the memory cell transistors 403 are also arranged in the order of ..., BC, BC, CD, CD, BC, .... Within the ..., (i-2)th, i-th, (i+2)th, ... blocks, the bit line 401B and the bit line 401C are connected by a MOS transistor 423 controlled by a select line SB. Within the ..., (i-1)th, (i+1)th, ... blocks, the bit line 401D and the bit line 401C are connected by a MOS transistor 425 controlled by a select line SD. Further, within ..., (i-2)th, i-th, (i+2)th, .. blocks, bit line 401B is connected to the virtual ground line 407 via a transistor 427 controlled by the block select line $BS_i$. Further, within the ..., (i-1)th, (i+1)th, ... blocks, the bit line 401D is connected to the main bit line 406 via a transistor 429 controlled by the (i+1)th block select line $BS_{i+1}$.

The data reading operation of the memory transistor 403BC will be described hereinbelow. When the i-th block select line $BS_i$ is set to the "H" level and the MOS transistor 427 is turned on, the bit line 401B and the virtual ground line 407 are connected to each other. Further, when the (i+1)th block select line $BS_{i+1}$ is set to the "H" level and the MOS transistor 429 is turned on, the bit line 401D and the main bit line 406 are connected to each other. Successively, when the select line SD is set to the "H" level, the MOS transistor 425 is turned on, so that the bit line 401D and the bit line 401C are connected to each other. Since the select line SB is at the "L" level, the MOS transistor 423 is turned off. Accordingly, the bit line 401B is set to the ground level and the bit line 401C is connected to the sense amplifier. Then, when the selected word line (e.g., $WL_0$) is set to the "H" level, current flows between the main bit line 406 and the virtual ground line 407 according to the value written in the memory transistor 403BC. This current is sensed by the sense amplifier. The current route at this time is shown by dashed lines in FIG. 7.

The data reading operation of the memory transistor 403CD will be described hereinbelow. When the i-th block select line $BS_i$ is set to the "H" level and the MOS transistor 427 is turned on, the bit line 401B and the virtual ground line 407 are connected to each other. Further, when the (i+1) th block select line $BS_{i+1}$ is set to the "H" level and the MOS transistor 429 is turned on, the bit line 401D and the main bit line 406 are connected to each other. Successively, when the select line SB is set to the "H" level, the MOS transistor 423 is turned on, so that the bit line 401B and the bit line 403C are connected to each other. Since the select line SD is at the "L" level, the MOS transistor 425 is turned off. Accordingly, the bit line 401C is set to the ground level, and the bit line 401D is connected to the sense amplifier. Successively, when the selected word line (e.g., $WL_0$) is set to the "H" level, current flows between the main bit line 408 and the virtual ground line 407 according to the value written in the memory transistor 403CD. This current is sensed by the sense amplifier.

In the more generic case, when the j-th block must be accessed, the j-th block select line and the (j+1)th block select line are set to the "H" level. As described above, it is possible to activate the selected block by turning on the two transistors arranged on the grounded side and the sense amplifier side. As a result, only a single block select signal line is allocated to the single block. Further, two select lines BS and SD are allocated to two cells. As a result, four signal lines in total are required for two blocks. That is, it is possible to reduce the signal lines by two, as compared with the conventional mask ROM and thereby to further reduce the cell area required for unit bits.

Further, in this embodiment, although the bit line 401C extends over all of the blocks, it is, of course, possible to divide the bit line 401C at appropriate intervals to reduce the junction capacitance due to wiring.

In the above-mentioned first, second and third embodiments of the mask ROM according to the present invention, since there exists no turn along the current path in data reading operation, the voltage drop value within the block will not fluctuate according to the physical position of the selected memory cell, thus, not reducing the margin of the sense amplifier.

Further, in the second and third embodiment, since the ground side block select line and the sense amplifier side block select line can be used in common in two adjacent memory cell blocks, it is possible to read information from blocks connected to both the select lines. Therefore, it is possible to reduce the number of block select lines by one for each block, as compared with the conventional mask ROM. Further, since the cell select lines can used in common, it is possible to reduce the cell select lines by one for each block, as compared with the conventional mask ROM. Further, since both the block select lines are positioned diagonally with respect to the block without having a turn in the current path, it is possible to reduce the length of the current path along the N conductive type diffusion layer by a half, as compared with the conventional mask ROM. Accordingly, the voltage drop can be reduced by half, so that a greater number of word lines (e.g., 32 lines) can be arranged within a single block in comparison with the conventional mask ROM, with the result that the memory cell area for each unit memory cells can be reduced. For instance, when 32 word lines are arranged for one block, it is possible to reduce the area per unit memory cells by about 9% in the case of the first embodiment, by about 10% in the case of the second embodiment, and about 13% in the case of the third embodiment all as compared with the conventional mask ROM.

What is claimed is:

1. A mask ROM having a plurality of memory cell blocks each composed of a main bit line, a ground line, and a plurality of memory cells for storing information; and a sense amplifier for reading the information stored in the memory cells via the main bit line, which comprises:

a plurality of first block selecting means for selecting a memory cell block to be connected to the main bit line from a plurality of the memory cell blocks; and a plurality of second block selecting means for selecting a memory cell block to be connected to the ground line from a plurality of the memory cell blocks, said first and second block selecting means being arranged alternately with the memory cell block sandwiched therebetween.

2. The mask ROM of claim 1, wherein said first and second block selecting means are shared by adjacent memory cell blocks.

3. The mask ROM of claim 2, which further comprises switching means connected between the main bit line and a plurality of said memory cell blocks, for connecting the main bit line to the selected memory cell block in response to a select command given by said first block selecting means.

4. The mask ROM of claim 1, which further comprises a plurality of bit lines connected to a plurality of the memory cells, respectively; and a plurality of word lines arranged so as to intersect the bit lines, for specifying a memory cell from a plurality of the memory cells in cooperation with the bit lines.

5. The mask ROM of claim 4, wherein a plurality of the memory cells are a plurality of transistors each having a source region and a drain region at intersections between the bit line and the word line and a channel region sandwiched between the intersections.

* * * * *